US006963082B2

(12) United States Patent
Murata

(10) Patent No.: US 6,963,082 B2
(45) Date of Patent: Nov. 8, 2005

(54) MULTI-CHIP PACKAGE DEVICE INCLUDING A SEMICONDUCTOR MEMORY CHIP

(75) Inventor: Nobukazu Murata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 81 days.

(21) Appl. No.: 10/670,349

(22) Filed: Sep. 26, 2003

(65) Prior Publication Data

US 2004/0061516 A1 Apr. 1, 2004

Related U.S. Application Data

(60) Provisional application No. 60/413,950, filed on Sep. 27, 2002.

(51) Int. Cl.[7] .................................................. H01L 23/58

(52) U.S. Cl. ......................... 257/48; 257/686; 257/690; 438/11; 438/14; 438/18; 324/754; 324/755; 324/763

(58) Field of Search ........................... 257/48, 686–690; 438/11, 14, 18; 324/754–755, 763

(56) References Cited

U.S. PATENT DOCUMENTS 6,801,048 B2 * 10/2004 Farnworth et al. .......... 324/763

* cited by examiner

*Primary Examiner*—Dung A. Le
(74) *Attorney, Agent, or Firm*—Nixon Peabody LLP; Donald R. Studebaker

(57) ABSTRACT

A multi-chip package device includes package terminals, a semiconductor memory chip and an interface chip. The semiconductor memory chip has a test circuit and a test terminal. The test circuit is enabled when a high voltage level is applied to the test terminal. The interface chip is connected to the package terminals and the semiconductor memory. The interface chip includes a control circuit, a high voltage generating circuit and a transferring circuit. The control circuit has memory terminals connected to the package terminals. The control circuit generates a test signal and an enable signal in response to signals received from the memory terminals. The high voltage generating circuit generates a high voltage signal having the high voltage level in response to the enable signal. The transferring circuit provides the high voltage signal to the memory chip in response to the test signal.

18 Claims, 6 Drawing Sheets

MULTI-CHIP PACKAGE DEVICE INCLUDING A SEMICONDUCTOR MEMORY CHIP

BACKGROUND OF THE INVENTION

The present invention relates to a multi-chip package device including a semiconductor memory chip, and particularly to a test circuit for a read only memory (ROM) chip having a floating gate.

In this type of circuit that has heretofore been used, a high voltage is applied to a terminal for inputting a signal such as an address to thereby assert a test circuit select signal so as to select a test circuit. An input terminal A corresponds to a suitable input terminal of a memory chip. Unless otherwise stated below in the present Specification, "L" indicates a ground level, and "H" indicates a power supply voltage level, respectively. Further, "HV" indicates a high voltage level for selecting a test circuit.

However, the conventional test circuit selecting method is predicated on the fact that it is possible to externally make direct contact with a terminal to which the high voltage level "HV" is applied. On the other hand, there may be cases where in a commercial product based on a multi-chip package (MCP) technology for laminating a plurality of chips into one package, the high voltage level "HV" cannot be externally applied to the above terminal. When, for example, a serial interface product is constituted by an MCP of a serial interface chip and a general purpose memory chip, it is not feasible to make contact with all of input terminals of a general purpose memory from outside.

SUMMARY OF THE INVENTION

Therefore, the present invention may provide an MCP product for a serial interface using a general purpose memory chip, wherein even when it is not possible to make contact with an input terminal of the general purpose memory chip from outside, a test circuit is selected to execute testing.

According to the present invention, a multi-chip package device includes package terminals, a semiconductor memory chip and an interface chip. The semiconductor memory chip has a test circuit and a test terminal. The test circuit is enabled when a high voltage level is applied to the test terminal. The interface chip is connected to the package terminals and the semiconductor memory. The interface chip includes a control circuit, a high voltage generating circuit and a transferring circuit. The control circuit has memory terminals connected to the package terminals. The control circuit generates a test signal and an enable signal in response to signals received from the memory terminals. The high voltage generating circuit generates a high voltage signal having the high voltage level in response to the enable signal. The transferring circuit provides the high voltage signal to the memory chip in response to the test signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
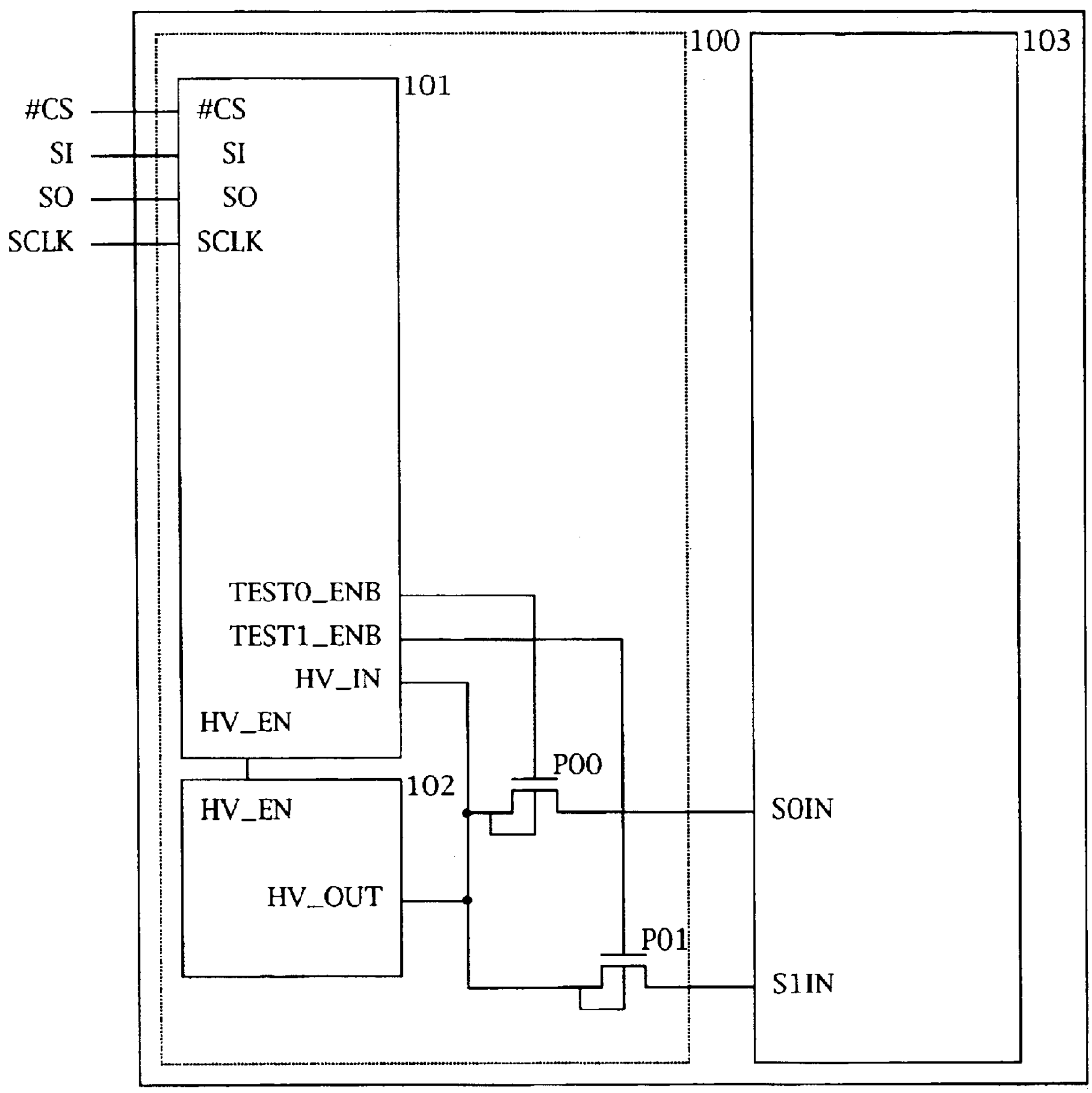
FIG. 1 is a configuration diagram showing a first embodiment of the present invention.

FIG. 1 is a configuration diagram of a serial interface memory showing a first embodiment of the present invention. A chip for a serial interface 100 and a general purpose memory chip 103 are brought into one package by MCP.

In FIG. 1, a terminal #CS, a terminal SI, a terminal SO and a terminal SCLK are a chip select terminal, a serial data input terminal, a serial data output terminal and a clock input terminal, respectively.

When a test circuit is selected, a high voltage level "HV" is applied to an input terminal S0IN and an input terminal S1IN. The input terminal S0IN and the input terminal S1IN correspond to arbitrary input terminals of the general purpose memory chip 103.

A control circuit 101 determines various operations from command codes inputted thereto to control a signal line HV_EN, a signal line TEST0_ENB, a signal line TEST1_ENB, etc. The signal line HV_EN is used to control an HV supply circuit 102 to be described later. The signal lines TEST0_ENB and the signal line TEST1_ENE are used to select the input terminals of the general purpose memory chip 103, to which the high voltage level "HV" is applied. The high voltage level "HV" inputted from a signal line HV_IN is used in an "H" level for each signal line for controlling a high voltage level "HV" applied to each of the signal line TEST0_ENB, the signal line TEST1_ENB, etc.

The HV supply circuit 102 is a boost or step-up circuit for generating a high voltage level "HV" from a power supply voltage. The signal line HV_EN is asserted to output the high voltage level "HV" from a signal line. HV_OUT.

Symbols P00 and P01 are respectively P channel MOS (hereinafter called PMOS) transistors. A drain electrode of the PMOS transistor P00 is connected to the terminal S0IN, and a source electrode and a substrate electrode thereof are connected to the signal line HV_OUT. A gate electrode of the PMOS transistor P00 is connected to the signal line TEST0_ENB. A drain electrode of the PMOS transistor P01 is connected to the signal line SLIN, and a source electrode and a substrate electrode thereof are connected to the signal line HV_OUT. A gate electrode of the PMOS transistor P01 is connected to the signal line TEST1_ENB.

Since other circuits are not necessary for description of the first embodiment, they are omitted.

The operation of the first embodiment of the present invention will next be explained with reference to FIG. 2.

Figure 2:
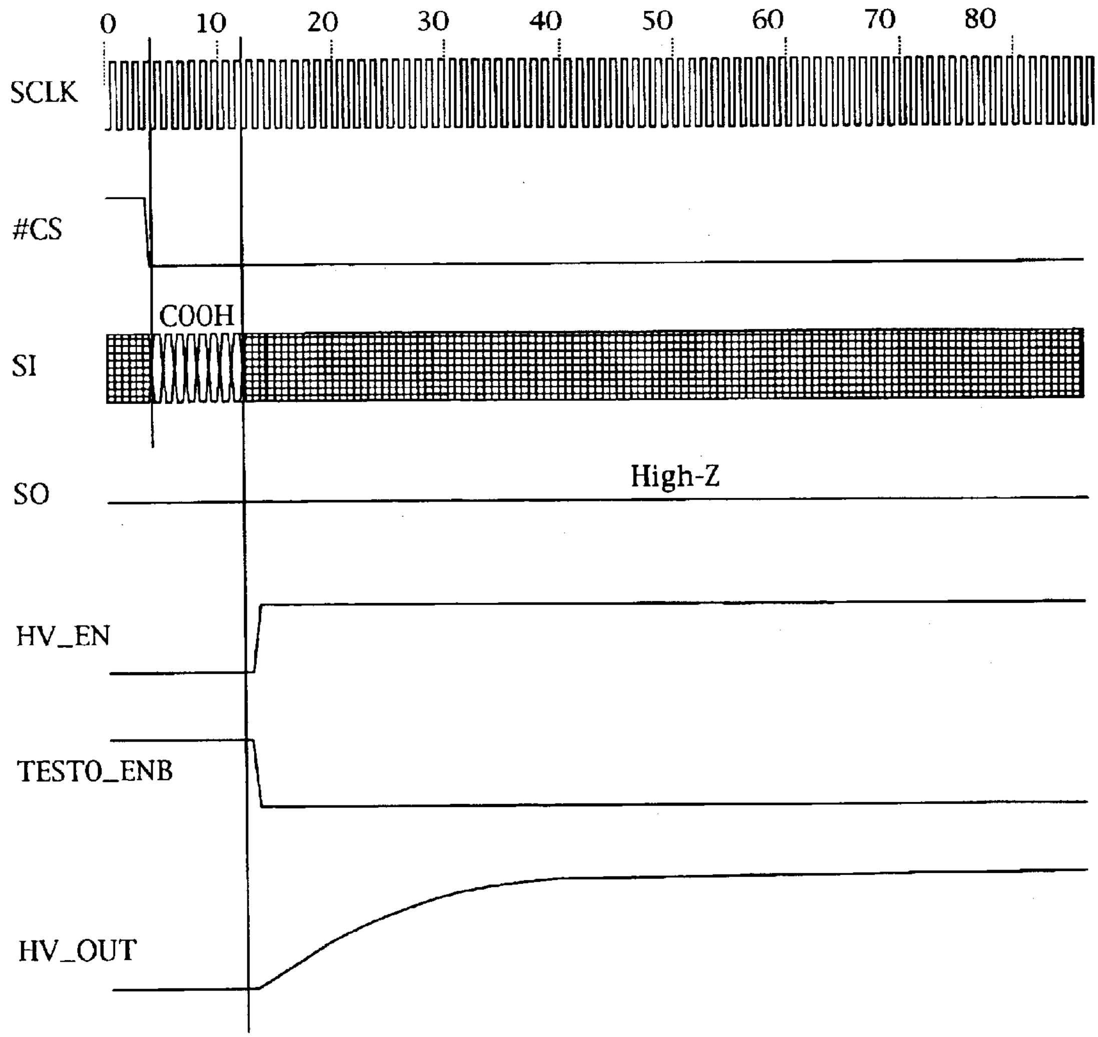
FIG. 2 is a timing chart of the first embodiment of the present invention.

FIG. 2 is a timing chart for describing the operation of the first embodiment of the present invention.

As shown in FIG. 1, the signal terminals of the serial interface memory comprise the four terminals #CS, SI, SO and SCLK. When in normal use, a command code of one byte is inputted from the terminal SI when the terminal #CS="L" level, thereby executing a predetermined operation. In the case of reading, an address is inputted thereto following the command code. With the completion of the address input, the corresponding data is outputted from the terminal SO. Thus, the one-byte command code is set to enable execution of various operations at the serial interface.

To this end, a command code (e.g., C00H, C01H or the like) for selecting the test circuit is set in the first embodiment. The signal line HV_EN is asserted by the input of the command code C00H so that the HV supply circuit 102 outputs a high voltage level "HV" to the signal line HV_OUT. Since the signal line TEST0_ENB goes an "L" level in accordance with the input of the command code C00H, the PMOS transistor P00 is brought into conduction so that the high voltage level "HV" is applied to the terminal S0IN through the signal line HV_OUT. Since the command is effective during a period in which the terminal #CS is of the "L" level, the HV supply circuit 102 continues to apply the high voltage level "HV" to the terminal S0IN. Similarly when it is desired to apply the high voltage level "HV" to the terminal S1IN, the command code C01H may be inputted. Incidentally, the command codes C00H and C01H are codes set for convenience. As the command codes, may be used arbitrary codes that uncompete with other command codes. Thus, when a plurality of test circuits are provided, the number of command codes can be increased to such an extent that the command codes do not compete with each other, according to the number of the test circuits.

According to the first embodiment of the present invention, as described above, a test circuit can be selected even where it is not possible to externally make contact with the corresponding input terminal of the general purpose memory chip at an MCP product for a serial interface which makes use of the general purpose memory chip. It is therefore feasible to execute testing.

Figure 3:
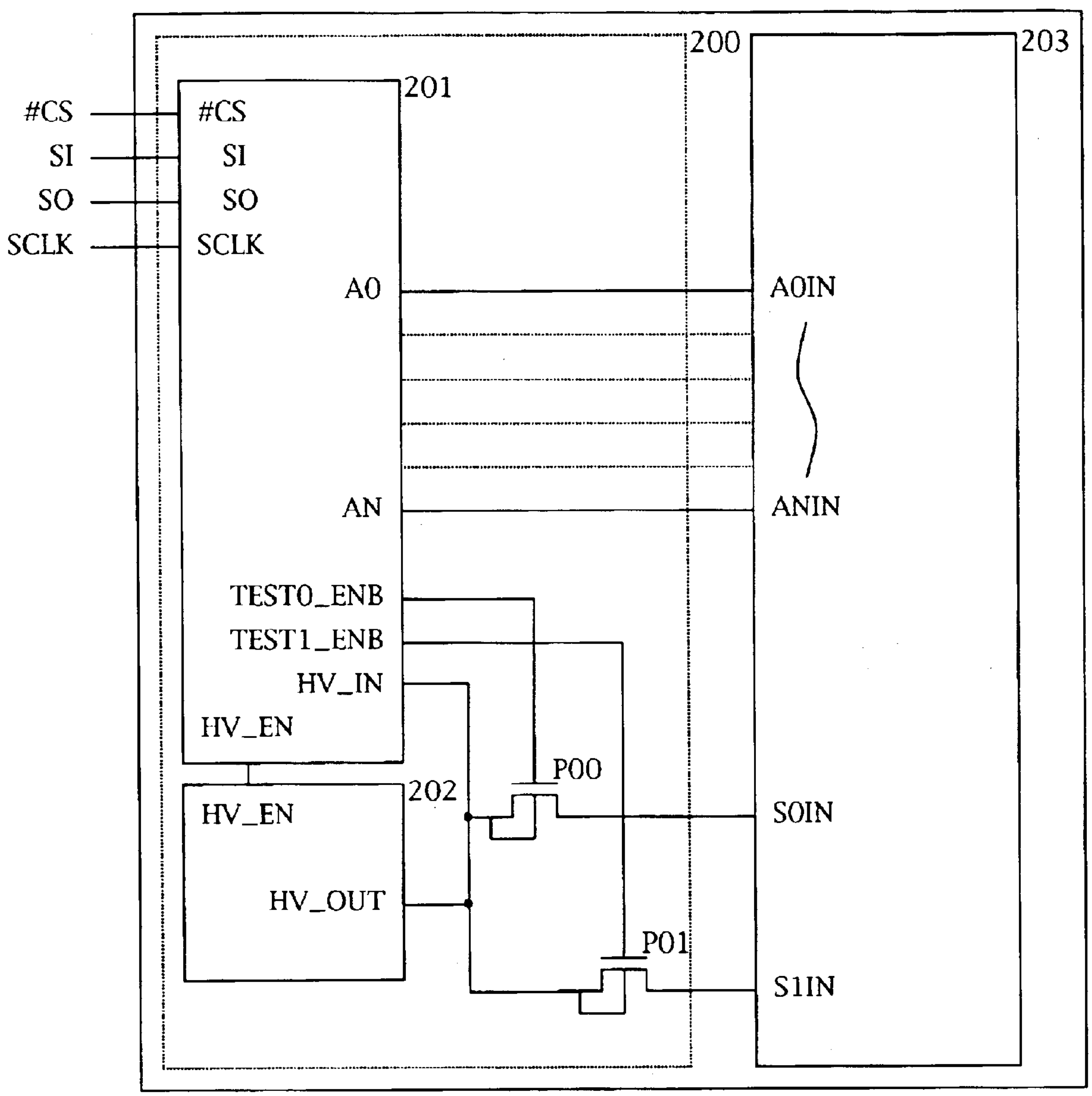
FIG. 3 is a configuration diagram illustrating a second embodiment of the present invention.

FIG. 3 is a configuration diagram illustrating a second embodiment of the present invention. In FIG. 3, terminals A0 through AN are respectively address output terminals for controlling addresses of a general purpose memory chip 203 supplied from a serial interface chip 200. Terminals A0IN through ANIN are respectively address input terminals of the general purpose memory chip 203. Since other configurations are similar to those employed in the first embodiment, their description will be omitted.

The operation of the second embodiment of the present invention will be explained using FIG. 4.

Figure 4:
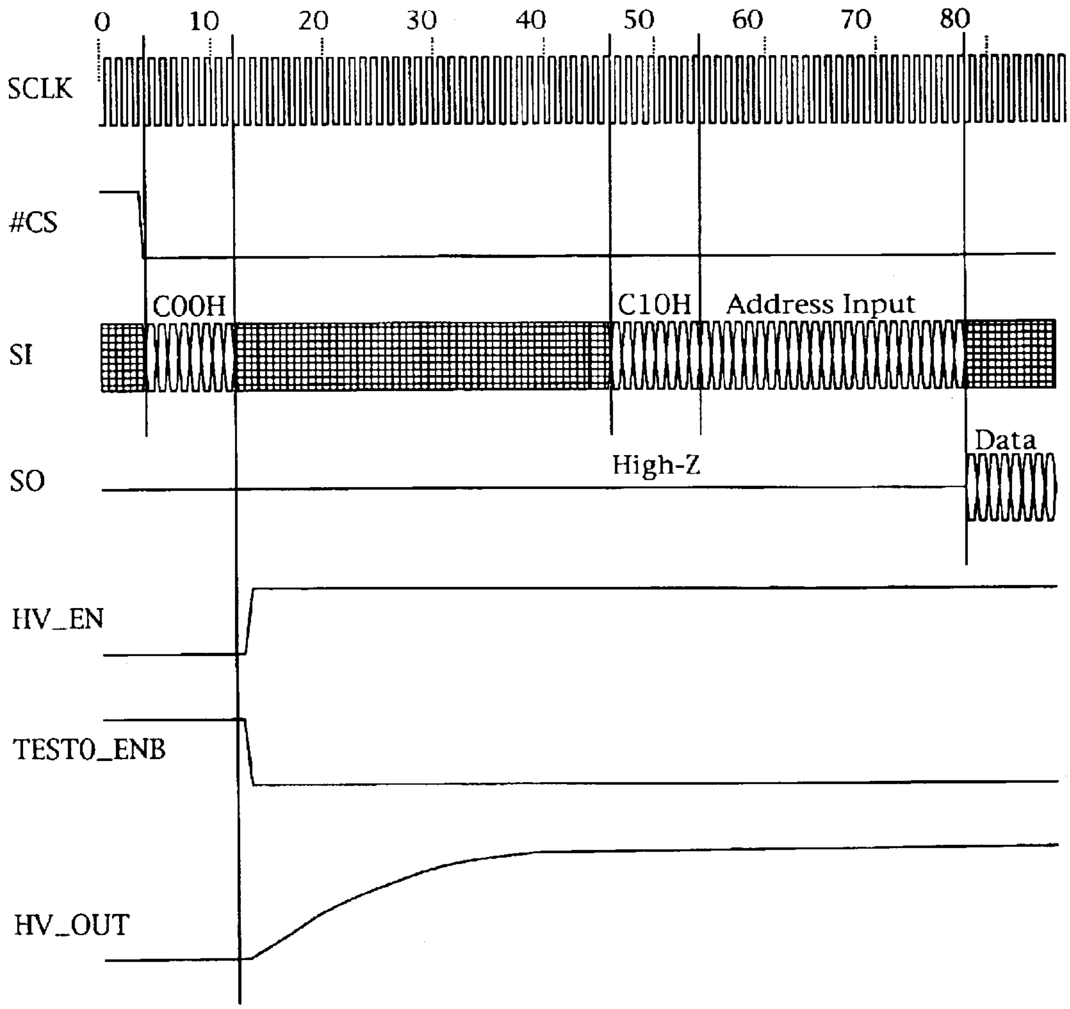
FIG. 4 is a timing chart of the second embodiment of the present invention.

FIG. 4 is a timing chart for describing the operation of the second embodiment of the present invention.

In the second embodiment, the signal line HV_EN is asserted by the input of a command code C00H in a manner similar to the first embodiment to drive the HV supply circuit 202. The signal line TEST0_ENB reaches an "L" level so that the PMOS transistor P00 is brought into conduction. Therefore, a high voltage level "HV" is applied from the signal line HV_OUT to the terminal S0IN. The operation of reading or the like is started according to the input of the command code upon the normal operation. In the second embodiment, however, circuits other than the HV supply circuit and a control system of the signal lines TEST0_ENB and TEST1_ENB respectively hold a state prior to the input of the command code. Accordingly, a command code (e.g., C10H) or the like for executing the reading can be executed after the input of the command code C00H.

According to the second embodiment of the present invention, as described above, a test for accessing a memory cell and executing a read operation can be carried out according to a procedure equivalent to the normal operation after the selection of a test circuit.

Incidentally, the read operation is made possible even in the first embodiment. Since, however, the first embodiment does not include a technique for accurately recognizing a time lag from the attainment of the output voltage of the HV supply circuit 102 to the high voltage level "HV" to the selection of the test circuit, it is difficult to measure the timing for fetching data outputted from the general purpose memory chip.

In the second embodiment, the command code for executing the read operation can be inputted since the time much longer than the time lag has elapsed. Since data is outputted with timing similar to the normal operation, it is easy to measure the timing for fetching the data.

Since a third embodiment of the present invention makes use of the same configuration as the second embodiment, a description about its configuration will be omitted.

The operation of the third embodiment of the present invention will be explained using FIG. 5.

Figure 5:
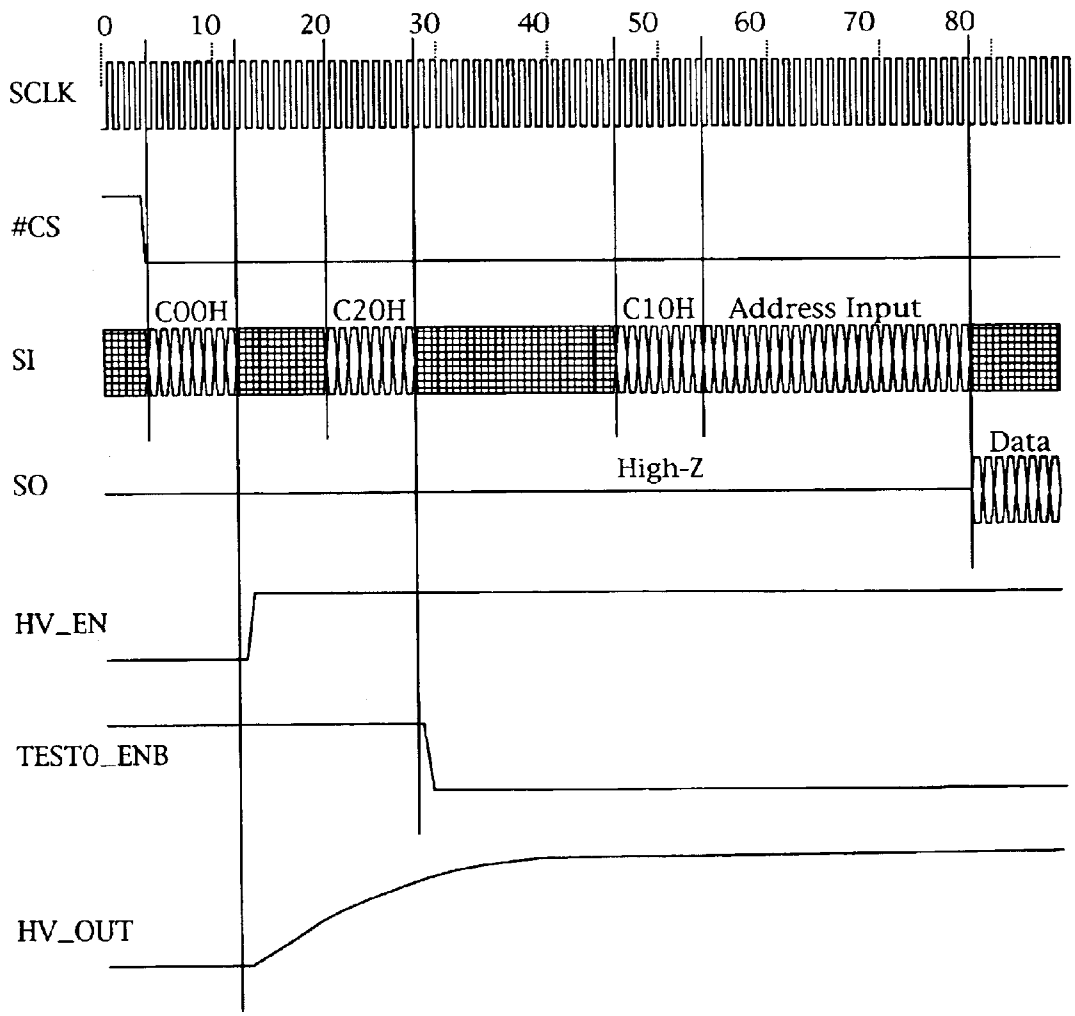
FIG. 5 is a timing chart of a third embodiment of the present invention.

FIG. 5 is a timing chart for describing the operation of the third embodiment of the present invention.

In the third embodiment, the signal line HV_EN is asserted by the input of a command code C00H so that the HV supply circuit 202 outputs a high voltage level "HV" to the signal line HV_OUT. Since, however, any of the signal line TEST0_ENB, signal line TEST1_ENB, and the like is not brought to an "L" level, the PMOS transistors P00 and P01 and the like are not brought into conduction. Thus, no high voltage level "HV" is applied to the terminals S0IN, S1IN and the like. A command code for selecting a test circuit is inputted following the command code C00H to thereby apply the high voltage level "HV" to the input terminal of the corresponding general purpose memory chip. When a command code C20H is inputted in success after the input of the command code C00H, for example, the signal line TEST0_ENB goes the "L" level, so that the PMOS transistor P00 is brought into conduction to apply the high voltage level "HV" to the terminal S0IN. On the other hand, when a command code C21H is inputted in succession after the input of the command code C00H, the signal line TEST1_ENB reaches the "L" level, so that the PMOS transistor P01 is brought into conduction to apply the high voltage level "HV" to the terminal S1IN. Further, if an address input is required, then the corresponding command code (e.g., C10H) is inputted in a manner similar to the second embodiment.

In the third embodiment of the present invention, as described above, the input of the command codes each of which selects the test circuit is brought into a hierarchical structure. Owing to the provision of the hierarchical structure, the number of command codes for selecting test circuits can be increased without concern for competition with other command codes at the normal operation. Although a procedure up to entering into a test operation increases, a temporal demerit is not caused because the time required to input the command code is shorter than a time lag taken till the HV supply circuit 202 outputs the high voltage level "HV". An operation subsequent to the selection of the test circuit is similar to either the first embodiment or the second embodiment.

Figure 6:
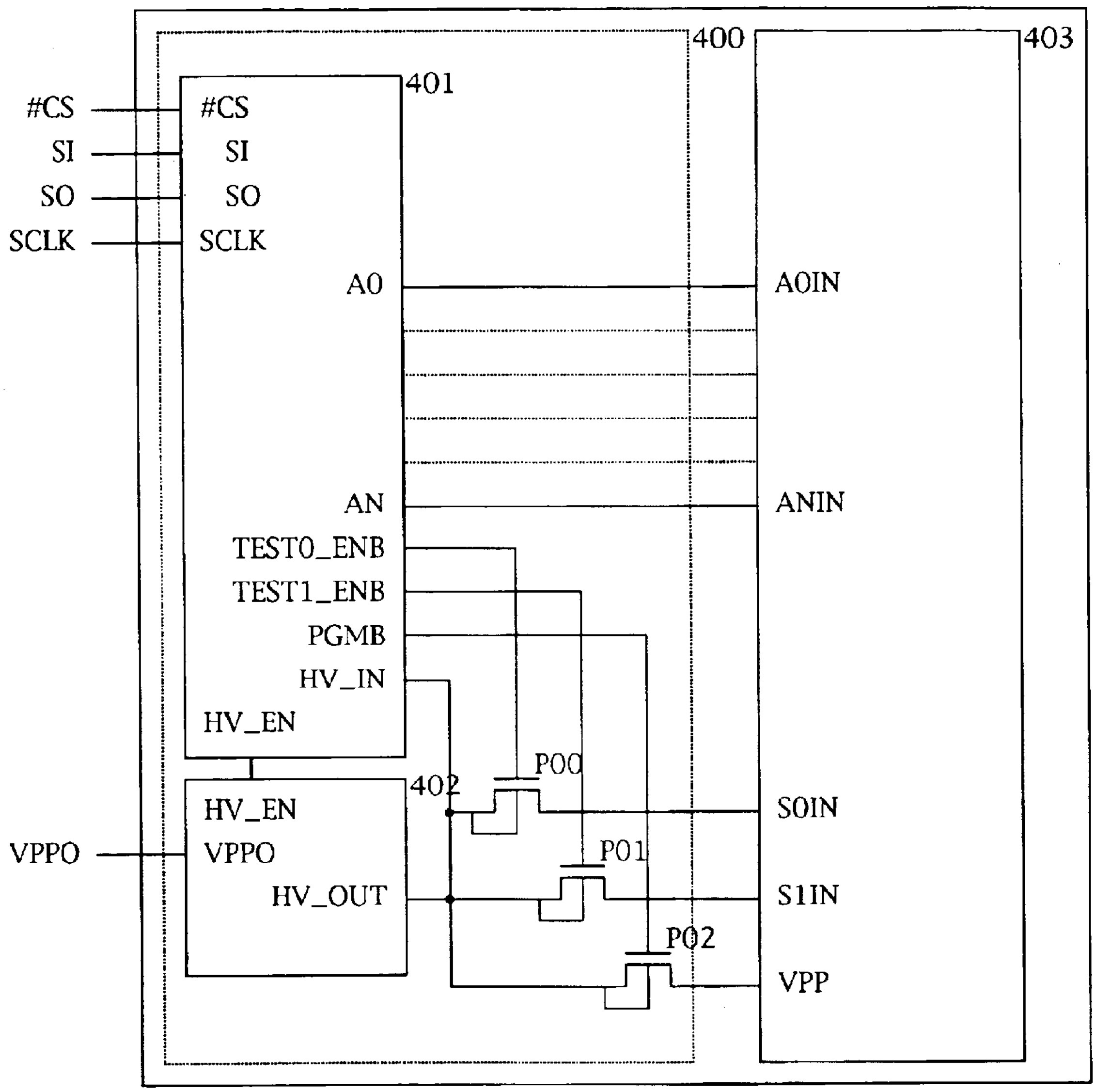
FIG. 6 is a configuration diagram depicting a fourth embodiment of the present invention.

FIG. 6 is a configuration diagram showing a fourth embodiment of the present invention.

In FIG. 6, a terminal VPPO is a source or power supply terminal normally used in a write operation. Upon the write operation, the terminal VPPO serves so as to supply a voltage equivalent to a high voltage level "HV" to a terminal VPP of a general purpose memory chip 403. The terminal VPP of the general purpose memory chip 403 is a power supply terminal used in the write operation in a manner similar to the terminal VPPO.

An HV supply circuit 402 supplies the high voltage level "HV" through the terminal VPPO and asserts a signal line HV_EN to thereby output the high voltage level "HV" from a signal line HV_OUT.

A drain electrode of a PMOS transistor P00 is connected to a terminal S0IN of the general purpose memory chip 403. A source electrode and a substrate electrode of the PMOS transistor P00 are connected to the terminal HV_OUT. A gate electrode of the PMOS transistor P00 is connected to a signal TEST0_ENB. A drain electrode of a PMOS transistor P01 is connected to a terminal S1IN of the general purpose memory chip 403. A source electrode and a substrate electrode of the PMOS transistor P01 are connected to the terminal HV_OUT. A drain electrode of the PMOS transistor P02 is connected to the terminal VPP of the general purpose memory chip 403. A source electrode and a substrate electrode of the PMOS transistor P02 are connected to the terminal HV_OUT. A gate electrode of the PMOS transistor P02 is connected to a terminal PGMB.

Since other configurations are similar to those employed in the third embodiment, their description will be omitted.

The operation of the fourth embodiment of the present invention will next be explained.

In the fourth embodiment, as distinct from the third embodiment, the high voltage level "HV" is supplied from the terminal VPPO without using a step-up circuit. Since a method of selecting a test circuit is equivalent to the third embodiment, its description will be omitted.

According to the fourth embodiment of the present invention, as described above, an advantageous effect similar to one obtained in the third embodiment is obtained. Since no step-up circuit is used, a layout area can be reduced by an omission of a circuit related to its step-up.

Incidentally, if a serial interface memory using a read only memory having a floating gate is adopted for all of the first to fourth embodiments, it can be applied to any devices.

While the present invention has been described with reference to the illustrative embodiments, this description is not intended to be construed in a limiting sense. Various modifications of the illustrative embodiments, as well as other embodiments of the. invention, will be apparent to those skilled in the art on reference to this description. It is therefore contemplated that the appended claims will cover any such modifications or embodiments as fall within the true scope of the invention.

What is claimed is:

1. A multi-chip package device comprising:

a plurality of package terminals;

a semiconductor memory chip having a test circuit and a test terminal, the test circuit is enabled when a high voltage level is applied to the test terminal; and an interface chip connected to the package terminals and the semiconductor memory, the interface chip including, a control circuit having a plurality of memory terminals connected to the package terminals, the control circuit generating a test signal and an enable signal in response to signals received from the memory terminals, a high voltage generating circuit connected to the control circuit, the high voltage generating circuit generates a high voltage signal having the high voltage level in response to the enable signal, and a transferring circuit connected to the control circuit, the high voltage circuit and the test terminal of the memory chip, the transferring circuit providing the high voltage signal to the memory chip in response to the test signal.

2. A multi-chip package device according to claim 1, wherein the memory terminals are serial interface memory terminals.

3. A multi-chip package device according to claim 2, wherein the serial interface memory terminals includes a chip select terminals, a serial data input terminal, a serial data output terminal and a clock input terminal.

4. A multi-chip package device according to claim 1, wherein the memory chip is a general purpose memory chip.

5. A multi-chip package device according to claim 1, wherein the transferring circuit includes a P channel MOS transistor having a gate connected to receive the test signal, a first terminal connected to receive the high voltage signal and a second terminal connected to the test terminal.

6. A multi-chip package device according to claim 1, wherein the control circuit receives the high voltage signal, and wherein the test signal has the high voltage level.

7. A multi-chip package device comprising:

a plurality of package terminals;

a semiconductor memory chip having a test circuit, a plurality of address input terminals and a test terminal, the test circuit is enabled when a high voltage level is applied to the test terminal; and an interface chip connected to the package terminals and the semiconductor memory, the interface chip including, a control circuit having a plurality of memory terminals connected to the package terminals and a plurality of address terminals for providing address signals based on signals received from the memory terminals, the control circuit generating a test signal and an enable signal in response to the received signals, a high voltage generating circuit connected to the control circuit, the high voltage generating circuit generates a high voltage signal having the high voltage level in response to the enable signal, and a transferring circuit connected to the control circuit, the high voltage circuit and the test terminal of the memory chip, the transferring circuit providing the high voltage signal to the memory chip in response to the test signal.

8. A multi-chip package device according to claim 7, wherein the memory terminals are serial interface memory terminals.

9. A multi-chip package device according to claim 8, wherein the serial interface memory terminals includes a chip select terminals, a serial data input terminal, a serial data output terminal and a clock input terminal.

10. A multi-chip package device according to claim 7, wherein the memory chip is a general purpose memory chip.

11. A multi-chip package device according to claim 7, wherein the transferring circuit includes a P channel MOS transistor having a gate connected to receive the test signal, a first terminal connected to receive the high voltage signal and a second terminal connected to the test terminal.

12. A multi-chip package device according to claim 7, wherein the control circuit receives the high voltage signal, and wherein the test signal has the high voltage level.

13. A multi-chip package device comprising:

a plurality of package terminals;

a semiconductor memory chip having a test circuit, a plurality of address input terminals, a high voltage input terminal and a test terminal, the test circuit is enabled when a high voltage level is applied to the test terminal; and an interface chip connected to the package terminals and the semiconductor memory, the interface chip including, a control circuit having a plurality of memory terminals connected to the package terminals and a plurality of address terminals for providing address signals based on signals received from the memory terminals, the control circuit generating a test signal and an enable signal in response to the received signals, a high voltage generating circuit connected to the control circuit, the high voltage generating circuit generates a high voltage signal having the high voltage level in response to the enable signal, and a transferring circuit connected to the control circuit, the high voltage circuit and the high voltage input terminal and the test terminal of the memory chip, the transferring circuit providing the high voltage signal to the memory chip in response to the test signal.

14. A multi-chip package device according to claim 13, wherein the memory terminals are serial interface memory terminals.

15. A multi-chip package device according to claim 14, wherein the serial interface memory terminals includes a chip select terminals, a serial data input terminal, a serial data output terminal and a clock input terminal.

16. A multi-chip package device according to claim 13, wherein the memory chip is a general purpose memory chip.

17. A multi-chip package device according to claim 13, wherein the transferring circuit includes a P channel MOS transistor having a gate connected to receive the test signal, a first terminal connected to receive the high voltage signal and a second terminal connected to the test terminal.

18. A multi-chip package device according to claim 13, wherein the control circuit receives the high voltage signal, and wherein the test signal has the high voltage level.

* * * * *